United States Patent [19]
Mueller

[11] Patent Number: 5,397,050
[45] Date of Patent: Mar. 14, 1995

[54] METHOD OF BONDING TUNGSTEN TITANIUM SPUTTER TARGETS TO TITANIUM PLATES AND TARGET ASSEMBLIES PRODUCED THEREBY

[75] Inventor: John J. Mueller, Columbus, Ohio

[73] Assignee: Tosoh SMD, Inc., Grove City, Ohio

[21] Appl. No.: 144,206

[22] Filed: Oct. 27, 1993

[51] Int. Cl.⁶ .................................................. B22F 7/08
[52] U.S. Cl. .................................... 228/193; 228/155; 228/235.1; 228/265; 228/262.71; 419/8
[58] Field of Search ............... 228/265, 155, 175, 193, 228/235.1, 262.71; 419/8

[56] References Cited

U.S. PATENT DOCUMENTS

| | | | |
|---|---|---|---|
| 4,731,116 | 3/1988 | Kuy | 75/238 |
| 4,838,935 | 6/1989 | Dunlop et al. | 75/230 |
| 4,943,362 | 7/1990 | Schlamp et al. | 204/298.13 |
| 4,960,651 | 10/1990 | Pettigrew et al. | 428/607 |
| 5,215,639 | 6/1993 | Boys | 204/192.12 |
| 5,230,459 | 7/1993 | Mueller et al. | 228/262.5 |
| 5,234,487 | 8/1993 | Wickersham, Jr. et al. | 75/248 |

Primary Examiner—Samuel M. Heinrich
Attorney, Agent, or Firm—Biebel & French

[57] ABSTRACT

A method of producing a sputter target assembly including a tungsten-titanium target attached to a titanium backing plate. The method includes consolidating a tungsten-titanium powder composition to form a target while simultaneously bonding the powder composition to the titanium backing plate to form an interdiffusion-type bond between the target and the backing plate such that the target assembly possesses extremely high temperature operating capability.

10 Claims, 2 Drawing Sheets

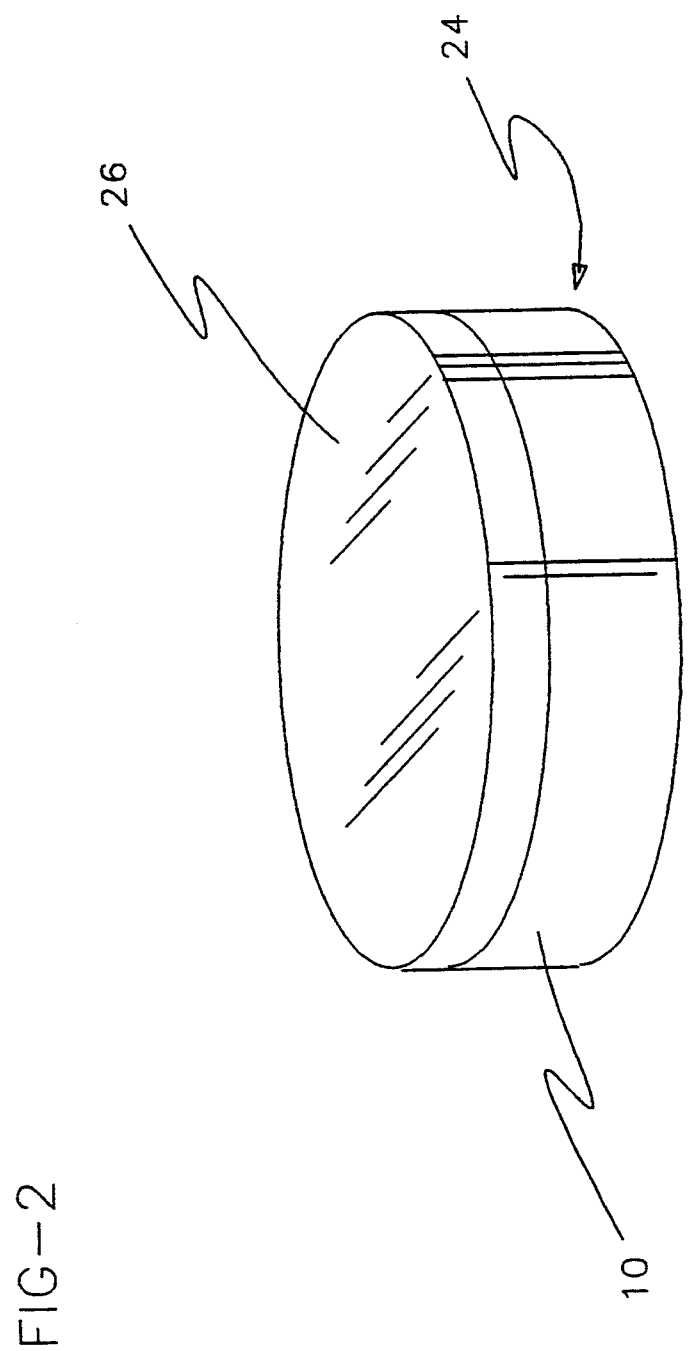

METHOD OF BONDING TUNGSTEN TITANIUM SPUTTER TARGETS TO TITANIUM PLATES AND TARGET ASSEMBLIES PRODUCED THEREBY

BACKGROUND OF THE INVENTION

1. Field of the Invention

The invention relates to a method of bonding tungsten-titanium sputter targets to titanium plates and to the target assemblies produced thereby. The bond between the tungsten-titanium targets and the titanium plates exhibit a high bond strength and a capability of withstanding high sputtering power levels.

2. Description of the Prior Art

Sputtering as a means to deposit thin films of a desired material on a substrate has become important in the manufacture of semi-conductor devices, such as integrated circuits. In a sputtering system, material to be deposited on a substrate is removed from a sputter target by bombardment of the target with ions.

In addition to the ion bombardment causing atoms or molecules of the target material to be ejected from the target, the process also causes thermal energy to be imparted to the target. In order to prevent the target from overheating, the target is typically mounted to a backing plate to facilitate cooling, and cooling water is circulated in contact with the backing plate such that heat energy is transferred from the target to the cooled backing plate. Thus, it is important that a good thermal bond exists between the target and the backing plate.

In one version of a sputter target assembly, the sputter target is physically soldered to the backing plate. For example, a tungsten-titanium sputter target may be soldered to a copper or austenitic (non-magnetic) stainless steel backing plate using indium, tin-indium or tin-silver alloy. Alternatively, a sputtered or electroplated metallic film may be applied to either or both the target and backing plate to enhance the wettability of the bond surfaces being joined by the solder connection, and in some cases a silver filled epoxy is used as the bonding agent.

In this sputtering design, the bonding surfaces between the target and the backing plate are planar and the backing plate further includes an annular ring extending downwardly from the planar surface wherein cooling of the target is accomplished by circulating water into a chamber formed within the annular ring and against the lower surface of the planar backing plate. In the past, this particular design of sputter target assembly has proven to have several drawbacks.

Since the target and backing plate are formed of different materials, they have different rates of thermal expansion. As a result, subsequent to heating of the target and backing plate to form the solder bond therebetween, the cooling of the assembly results in the target material being bowed wherein the target assumes a convex shape due to the target having a lower rate of thermal expansion than the backing plate. Thus, a flattening operation is subsequently required to bring the target back to its original planar shape. This flattening operation induces a strain on the bond area such that the solder must be sufficiently forgiving to accommodate the strain induced by this thermal distortion.

In addition, if the sputter target is operated at a high sputtering power level, there is the danger of the target becoming overheated to the point of causing the solder joint between the target and the backing plate to melt, thus causing failures in the sputter target equipment, resulting in needless downtime of the equipment.

In some target assemblies the degree of bowing of the target assembly is minimized by incorporating a backing plate made of titanium which has a thermal expansion rate more closely matched to that of the tungsten-titanium target. However, it is extremely difficult to produce a reliable solder bond with the titanium plate because of the non-wetting characteristics of titanium. Further, if a suitable bond is formed with one of the solders having a relatively low melting point, the utility of the assembly is limited to the lower operating temperatures for the target, such that the use of the target assembly is limited.

Accordingly, there is a need for a sputter target assembly wherein the thermal expansion rates of the target and an associated backing plate are closely matched. In addition, there is a need for such a target assembly wherein a durable bond is formed between a tungsten-titanium target and a titanium backing plate.

SUMMARY OF THE INVENTION

The present invention provides a method of forming a sputter target assembly wherein a tungsten-titanium sputter target is bonded to a titanium plate and the target assembly is resistant to the effects of heating produced by high sputtering power levels.

In the preferred embodiment of the invention, a tungsten-titanium sputter target is produced simultaneously with the step of bonding the target to a titanium backing plate. The bond thus produced is of the diffusion type which provides greater strength and higher operating temperature capability than that provided by prior art target assemblies. The method is carried out using a hot isostatic press (HIP) process to consolidate a tungsten-titanium powder composition into a target while simultaneously causing the consolidating material to bond to a titanium backing plate. After the target is formed and bonded to the backing plate, the assembly is then flattened at an elevated temperature and then machined to the final desired dimensions for the assembly.

As a result of combining the step of powder consolidation with the step of producing the bond between the target and backing plate, the interfering effect of titanium surface film on the bond development is minimized in order to ensure that a particularly strong bond is formed between the target and the backing plate.

Therefore, it is an object of the present invention to simultaneously consolidate a powder composition into a target while producing a bond between the target and a difficult-to-bond backing plate material.

It is a further object of the invention to provide such a method wherein the bond between the target and the backing plate possesses high operating temperature capability.

Other objects and advantages of the invention will be apparent from the following description, the accompanying drawings, and the appended claims.

BRIEF DESCRIPTION OF THE DRAWINGS

FIG. 2 shows a sputter target assembly made in accordance with the present invention.

DETAILED DESCRIPTION OF THE PREFERRED EMBODIMENT

The present invention comprises the pressure consolidation of a tungsten-titanium powder composition and the simultaneous bonding of the consolidated material to a titanium backing plate, as well as a sputter target assembly produced thereby.

With reference to FIGS. 1A–1D, the method of producing the tungsten-titanium target assembly of the present invention comprises placing a titanium plate 10 within a hot isostatic press (HIP) can 12. The backing plate 10 preferably includes a freshly machined flat upper surface 14 facing upwardly within the can 12.

Figure 1B:
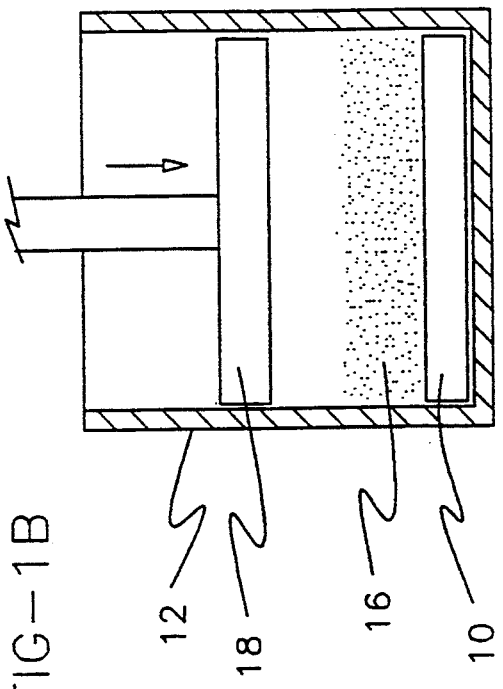
FIGS. 1A–1D diagrammatically illustrate the series of steps performed in accordance with the method of the present invention.
Figure 1D:
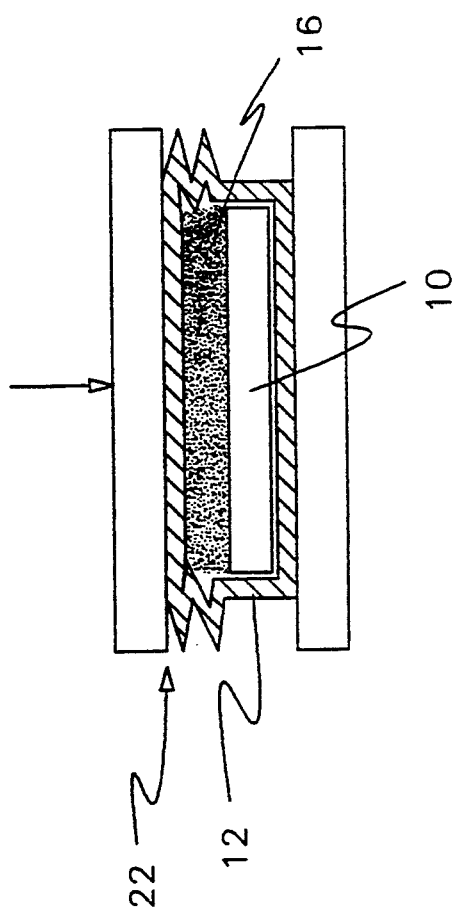
Figure 1A:
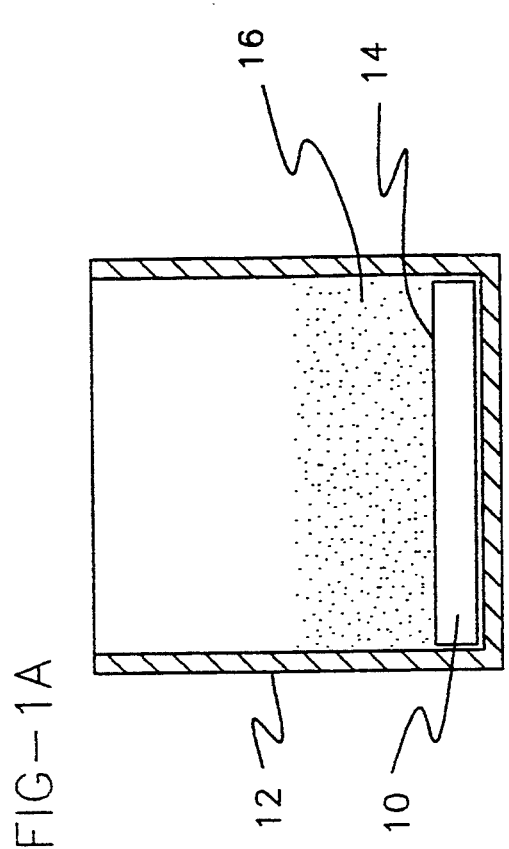

The backing plate 10 is overlaid with a leveled out blended elemental tungsten-titanium powder composition 16, as is illustrated in FIG. 1A. The powder 16 is preferably a composition of tungsten and titanium powders combined in accordance with the teachings of U.S. Pat. No. 5,234,487 (Wickersham et al.), which patent is assigned to the assignee of the present invention and is incorporated herein by reference.

A pressing punch 18 is then inserted into the can 12 above the powder 16 and the powder is compacted in a ram-type press at room temperature until the powder 16 is compressed to at least 50% of its final density, as shown in FIG. 1B. It should be noted that the initial thickness of the tungsten-titanium powder layer 16 must be selected such that it is adequate to obtain the desired final full density thickness at the conclusion of the target assembly forming process.

Figure 1C:
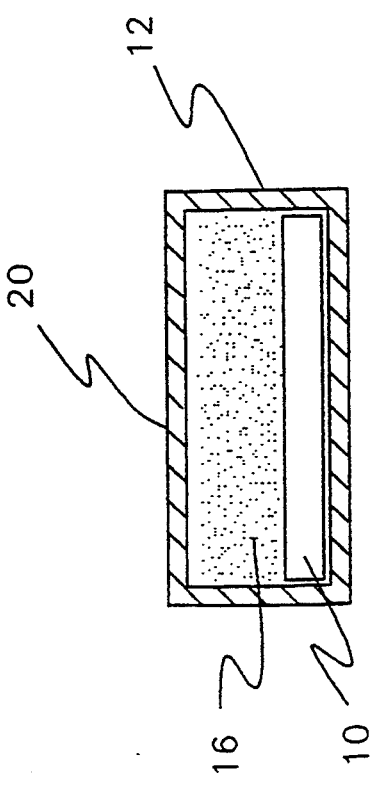

After the initial compaction of the powder 16, a top closure plate 20 is welded onto the can 12 to form a can assembly defining a vacuum tight closure, as shown in FIG. 1C. Further, residual air is removed from the interior of the can 12 through a tube attached thereto.

Next, the can assembly is subjected to a HIP process at a predetermined temperature and pressure for a selected time period. The particular conditions used for the HIP process are selected to meet the final target material requirement as well as to achieve a sound bond between the powder composition 16 forming the target and the backing plate 10. The above referenced U.S. patent describes typical pressure, time, and temperature conditions for forming the tungsten-titanium powder composition 16 into an acceptable target structure and those conditions are therefore not repeated herein. In a preferred HIP process, the can assembly may be subjected to a temperature of 800° C. and a pressure of 200 MPa for a time period of 4 hours.

After the HIP process has been completed, the HIP can assembly is heated to a temperature which is no greater than the HIP temperature until the entire can assembly is at a uniform temperature, such as 775° C., and the can assembly is placed in a platen press 22 to press the can assembly to a desired flatness as is shown in FIG. 1D.

Finally, the flattened assembly may then be machined by conventional means to desired dimensions for the final target assembly. FIG. 2 illustrates the final target assembly 24 wherein the consolidated powder composition 16 has been formed into a target 26 which is bonded to the backing plate 10. The bond between the tungsten-titanium target 26 and the titanium backing plate 10 is of the interdiffusion type wherein the titanium particles within the target 26 are joined to the titanium plate 10 with a lack of defined interface because of the high degree of material straining that occurs during the HIP deformation of both the powder composition 16 and the backing plate 10. For example, during the consolidation of the powder composition 16, the titanium plate 10 undergoes a reduction in diameter, as a result of being drawn radially inwardly by the tungsten-titanium powder composition 16 as it contracts and increases in density. The surface straining that occurs during this phase of operation aids in producing a sound metallurgical bond between the target 26 and the backing plate 10. Further, the flattening of the bonded assembly causes only a minor strain effect on the bond interface as a result of the forgiving nature of the titanium at the elevated flattening temperature.

The above-described method for producing a consolidated tungsten-titanium target bonded to a titanium backing plate in a single operation reduces the amount of material required for producing the target assembly 24 as well as reduces the machining time required for production of the target assembly. In addition, the present method eliminates the need to fully machine both the target and the backing plate before subjecting the components to a bonding operation, and further eliminates the need for soldering and any pretreatment of the surfaces, such as sputter deposition of a wettable material on the contact surfaces of the target and backing plate.

Further, producing the bond between the target 26 and the backing plate 10 simultaneously with the step of consolidating the powder composition 16 decreases the effect of the titanium surface film which has typically interfered with bond development in prior art target assemblies.

Also, by producing an interdiffusion bond between the target 26 and the backing plate 10 with the target 26 and the backing plate having closely matched thermal expansion rates, the final target assembly 24 has a greater strength and higher operating temperature capability than prior art target assemblies, and thus is operable over a wide range of sputtering power levels.

While the method herein described, and the product produced by this method, constitute a preferred embodiment of this invention, it is to be understood that the invention is not limited to this precise method and product, and that changes may be made in either without departing from the scope of the invention, which is defined in the appended claims.

What is claimed is:

1. A method of forming a sputter target assembly comprising the steps of:

(a) providing a backing plate;

(b) providing a powder composition;

(c) simultaneously pressure consolidating said powder composition to form a target portion and forming a bond between said backing plate and said target portion, said step (c) being performed in a hot isostatic press process wherein said backing plate and said powder composition are contained within a can subjected to a predetermined pressure and temperature to form a can assembly, said method further including the steps of heating said can assembly to a temperature no greater than said predetermined temperature and .pressing said can assembly in a platen press subsequent to step (c).

2. The method as in claim 1, wherein said backing plate comprises titanium and said powder composition comprises tungsten and titanium powders.

3. The method as in claim 2, wherein an interdiffusion-type bond is formed between said backing plate and said titanium in said powder composition during step (c).

4. The method as in claim 1, including the step of machining said can assembly subsequent to said step of pressing said can assembly in a platen press.

5. The method as in claim 1, further including the step of compacting said powder composition on said backing plate prior to step (c).

6. The method as in claim 1, including the step of causing said plate to undergo a reduction in diameter whereby surface straining occurs to strengthen the bond between said backing plate and said target portion.

7. The method as in claim 1, wherein the thermal expansion rate for said backing plate is closely matched to the thermal expansion rate for said target portion.

8. A method of forming a tungsten-titanium sputter target assembly comprising the steps of:
 (a) placing a titanium plate within a can;
 (b) placing powders of titanium and tungsten on said plate; and
 (c) subjecting said can to a predetermined pressure and temperature whereby said powders of titanium and tungsten are compacted to form a target portion and are bonded to said plate, said step (c) being performed in a hot isostatic press process, evacuating said can prior to said step (c), and pressing said titanium and tungsten powders prior to said step (c) in a ram-type press until said powders are at least 50 percent dense.

9. The method as in claim 8, wherein step (c) forms a can assembly and including the step of heating said can assembly to a temperature no greater than said predetermined temperature and pressing said can assembly in a platen press to flatten said can assembly.

10. The method as in claim 9, including the step of machining said can assembly to predetermined final dimensions for said target assembly subsequent to said step of pressing said can assembly in a platen press.

* * * * *